(12) United States Patent
Chang et al.

(10) Patent No.: US 11,062,941 B2
(45) Date of Patent: Jul. 13, 2021

(54) CONTACT CONDUCTIVE FEATURE FORMATION AND STRUCTURE

(71) Applicant: Taiwan Semiconductor Manufacturing Company, Ltd., Hsinchu (TW)

(72) Inventors: Ken-Yu Chang, Hsinchu (TW); Chun-I Tsai, Hsinchu (TW); Ming-Hsing Tsai, Chu-Pei (TW); Wei-Jung Lin, Hsinchu (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 0 days.

(21) Appl. No.: 16/806,931

(22) Filed: Mar. 2, 2020

(65) Prior Publication Data
US 2020/0203222 A1    Jun. 25, 2020

Related U.S. Application Data

(63) Continuation of application No. 16/032,416, filed on Jul. 11, 2018, now Pat. No. 10,580,693.

(51) Int. Cl.
*H01L 29/66* (2006.01)
*H01L 21/768* (2006.01)
*H01L 21/8234* (2006.01)
*H01L 21/67* (2006.01)

(52) U.S. Cl.
CPC .. *H01L 21/76846* (2013.01); *H01L 21/67075* (2013.01); *H01L 21/76877* (2013.01); *H01L 21/823418* (2013.01); *H01L 21/823475* (2013.01); *H01L 29/66545* (2013.01)

(58) Field of Classification Search
None
See application file for complete search history.

(56) References Cited

U.S. PATENT DOCUMENTS

| | | | |
|---|---|---|---|
| 2002/0031911 A1 | 3/2002 | Pyo | |
| 2002/0106881 A1* | 8/2002 | Jain | H01L 21/76862 438/600 |
| 2010/0015789 A1* | 1/2010 | Moritoki | H01L 21/76832 438/586 |
| 2010/0273321 A1 | 10/2010 | Wang et al. | |
| 2011/0193241 A1 | 8/2011 | Yen et al. | |
| 2017/0222014 A1* | 8/2017 | Tak | H01L 21/76895 |
| 2019/0164823 A1 | 5/2019 | Wang et al. | |

FOREIGN PATENT DOCUMENTS

KR   20010112891 A   12/2001

* cited by examiner

*Primary Examiner* — Hsien Ming Lee
(74) *Attorney, Agent, or Firm* — Slater Matsil, LLP

(57) ABSTRACT

Generally, the present disclosure provides example embodiments relating to conductive features, such as metal contacts, vias, lines, etc., and methods for forming those conductive features. In an embodiment, a barrier layer is formed along a sidewall. A portion of the barrier layer along the sidewall is etched back by a wet etching process. After etching back the portion of the barrier layer, an underlying dielectric welding layer is exposed. A conductive material is formed along the barrier layer.

21 Claims, 12 Drawing Sheets

CONTACT CONDUCTIVE FEATURE FORMATION AND STRUCTURE

PRIORITY CLAIM AND CROSS-REFERENCE

This application is a continuation of U.S. application Ser. No. 16/032,416, now U.S. Pat. No. 10,580,693, filed on Jul. 11, 2018, which application is hereby incorporated herein by reference

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (e.g., the number of interconnected devices per chip area) has generally increased while geometry size (e.g., the smallest component (or line) that can be created using a fabrication process) has decreased. This scaling down process generally provides benefits by increasing production efficiency and lowering associated costs.

Accompanying the scaling down of devices, manufacturers have begun using new and different materials and/or combination of materials to facilitate the scaling down of devices. Scaling down, alone and in combination with new and different materials, has also led to challenges that may not have been presented by previous generations at larger geometries.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
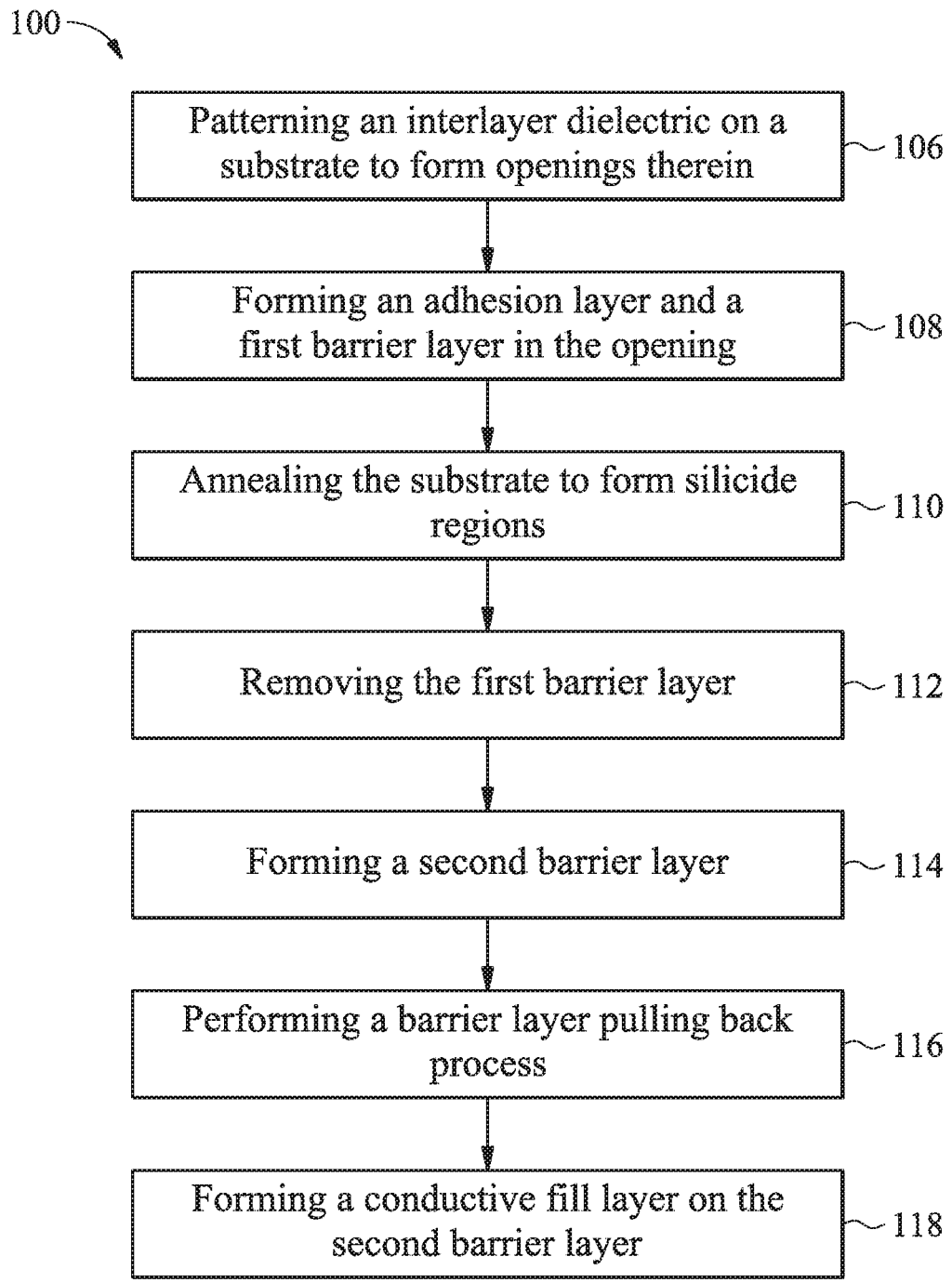
FIG. 1 is a flow chart of an example method for forming conductive features in accordance with some embodiments

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Generally, the present disclosure provides example embodiments relating to conductive features, such as metal contacts, vias, lines, etc., and methods for forming those conductive features. In some examples, a barrier layer and/or welding layer formed in an opening through a dielectric layer is pulled-back (e.g., etched) to have a height difference in the opening that is below the top surface of the dielectric. Accordingly, a pull-back (e.g., etch) is performed to remove redundant structures of the barrier layer and/or welding layer at corners of the opening to improve profile control and dimension accuracy. Among other things, this helps to reduce a formation of voids during the depositing of a conductive material on the barrier layer and/or adhesion.

Example embodiments described herein are described in the context of forming conductive features in Front End of the Line (FEOL) and/or Middle End of the Line (MEOL) processing for transistors. Implementations of some aspects of the present disclosure may be used in other processes and/or in other devices. For example, example embodiments may be implemented in Back End of the Line (BEOL) processing. Some variations of the example methods and structures are described. Although method embodiments may be described in a particular order, various other method embodiments may be performed in any logical order and may include fewer or more steps than what is described herein. In some figures, some reference numbers of components or features illustrated therein may be omitted to avoid obscuring other components or features; this is for ease of depicting the figures.

FIG. 1 depicts an exemplary flow diagram of a process 100 performed to form a semiconductor device structure in accordance with some embodiments. FIGS. 2 through 12 illustrate views of respective intermediate structures at respective stages during an example method for forming conductive features in accordance with some embodiments. The intermediate structures, as described in the following, are used in the implementation of Field Effect Transistors (FETs). Other structures may be implemented in other example embodiments.

Figure 2:
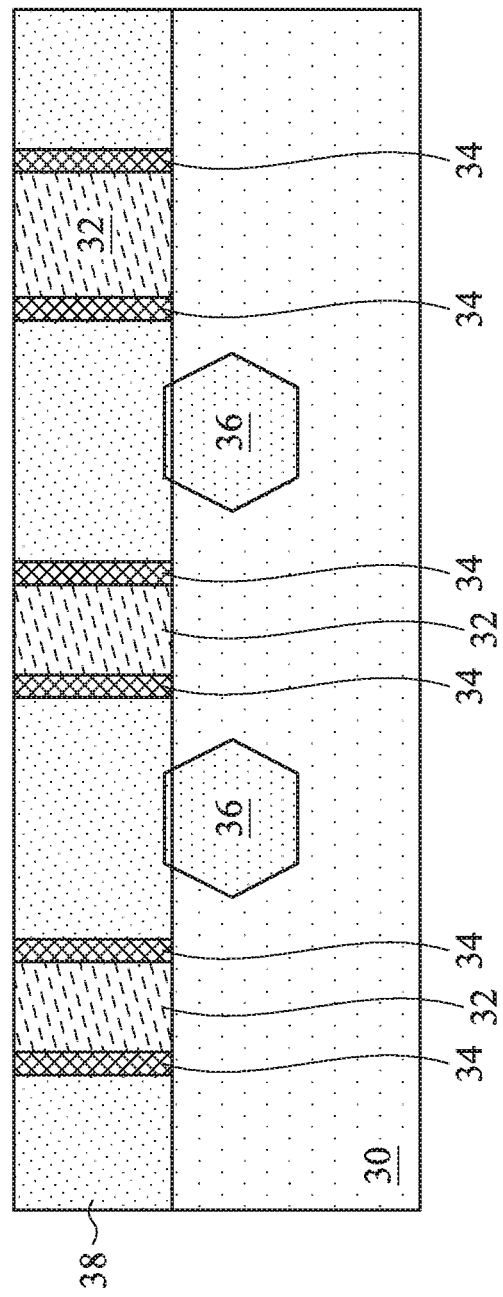
FIGS. 2 through 12 are cross-sectional views of respective intermediate structures during an example method for forming conductive features in accordance with some embodiments.

As illustrated in the figures and described herein, the devices are Field Effect Transistors (FETs), which may be planar FETs or FinFETs. In other implementations, the devices can include Vertical Gate All Around (VGAA) FETs, Horizontal Gate All Around (HGAA) FETs, bipolar junction transistors (BJTs), diodes, capacitors, inductors, resistors, etc. In accordance with planar FETs and/or FinFETs, gate stacks 32 are formed on active areas of the semiconductor substrate 30, as shown in FIG. 2. In planar FETs, the active areas can be a portion at the top surface of the semiconductor substrate 30 delineated by isolation regions. In FinFETs, the active areas can be three-dimensional fins protruding from between isolation regions on the semiconductor substrate 30. The semiconductor substrate 30 can be or include a bulk semiconductor substrate, a semiconductor-on-insulator (SOI) substrate, or another substrate. The semiconductor material of the semiconductor substrate 30 can include or be an elemental semiconductor like silicon (e.g., crystalline silicon like Si<100> or Si<111>) or germanium, a compound or alloy semiconductor, the like, or a combination thereof. The semiconductor material of the semiconductor substrate 30 may be doped or undoped, such as with a p-type or an n-type dopant. Other substrates, such as a multi-layered or gradient substrate may also be used. In some embodiments, the semiconductor material of the semiconductor substrate may include an elemental semiconductor like silicon (Si) and germanium (Ge); a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or a combination thereof.

The gate stacks 32 can be operational gate stacks like in a gate-first process or can be dummy gate stacks like in a replacement gate process. In the replacement gate process, each gate stack 32 can comprise a dielectric layer over the active area, a gate layer over the dielectric layer, and, in some instances, a mask layer over the gate layer, which gate stack 32 is later replaced by a metal gate structure that can include a high-k dielectric material. A high-k dielectric material may have a k value greater than about 7.0, and may include a metal oxide of or a metal silicate of hafnium (Hf), aluminum (Al), zirconium (Zr), lanthanum (La), magnesium (Mg), barium (Ba), titanium (Ti), lead (Pb), multilayers thereof, or a combination thereof. The gate layer (e.g., gate electrode) may include or be silicon (e.g., polysilicon, which may be doped or undoped), a metal-containing material (such as titanium, tungsten, aluminum, ruthenium, TiN, TaN, TaC, Co, a combination thereof (such as a silicide (which may be subsequently formed), or multiple layers thereof. The mask layer may include or be silicon nitride, silicon oxynitride, silicon carbon nitride, the like, or a combination thereof. Processes for forming or depositing the dielectric layer, gate layer, and mask layer include thermal and/or chemical growth, Chemical Vapor Deposition (CVD), Plasma-Enhanced CVD (PECVD), Molecular-Beam Deposition (MBD), Atomic Layer Deposition (ALD), Physical Vapor Deposition (PVD), and other deposition techniques. The layers for the gate stacks 32 may then be patterned to be the gate stacks 32, for example, using photolithography and one or more etch processes. For example, a photo resist can be formed on the mask layer (or gate layer, for example, if no mask layer is implemented), such as by using spin-on coating, and can be patterned by exposing the photo resist to light using an appropriate photomask. Exposed or unexposed portions of the photo resist may then be removed depending on whether a positive or negative resist is used. The pattern of the photo resist may then be transferred to the layers of the gate stacks 32, such as by using one or more suitable etch processes. The one or more etch processes may include a reactive ion etch (RIE), neutral beam etch (NBE), the like, or a combination thereof. The etching may be anisotropic. Subsequently, the photo resist is removed in an ashing or wet strip processes, for example.

Gate spacers 34 are formed along sidewalls of the gate stacks 32 and over the active areas on the semiconductor substrate 30. The gate spacers 34 may be formed by conformally depositing one or more layers for the gate spacers 34 and anisotropically etching the one or more layers, for example. The gate spacers 34 may include or be silicon nitride, silicon oxynitride, silicon carbon nitride, the like, multi-layers thereof, or a combination thereof.

Source/drain regions 36 are formed in the active regions on opposing sides of the gate stack 32. In some examples, the source/drain regions 36 are formed by implanting dopants into the active areas using the gate stacks 32 and gate spacers 34 as masks. Hence, source/drain regions 36 can be formed by implantation on opposing sides of each gate stack 32. In other examples, the active areas may be recessed using the gate stacks 32 and gate spacers 34 as masks, and epitaxial source/drain regions 36 may be epitaxially grown in the recesses. Epitaxial source/drain regions 36 may be raised in relation to the active area. The epitaxial source/drain regions 36 may be doped by in situ doping during the epitaxial growth and/or by implantation after the epitaxial growth. The epitaxy source/drain regions 36 may include or be silicon germanium, silicon carbide, silicon phosphorus, silicon carbon phosphorus, germanium, a III-V compound semiconductor, a II-VI compound semiconductor, or the like. The epitaxy source/drain regions 36 may be formed in the recesses by an appropriate epitaxial growth or deposition process. In some examples, epitaxy source/drain regions 36 can have facets, which may correspond to crystalline planes of the substrate 30. Hence, source/drain regions 36 can be formed by epitaxial growth, and possibly with implantation, on opposing sides of each gate stack 32.

A first interlayer dielectric (ILD) 38 is formed between the gate stacks 32 and over the semiconductor substrate 30. The first ILD 38 is deposited over the active areas, gate stacks 32, and gate spacers 34. In some examples, an etch stop layer (not shown) may be conformally deposited over the active areas, gate stacks 32, and gate spacers 34. Generally, an etch stop layer can provide a mechanism to stop an etching process when forming, e.g., contacts or vias. An etch stop layer may be formed of a dielectric material having a different etch selectivity from adjacent layers, for example, the first ILD 38. The etch stop layer may comprise or be silicon nitride, silicon carbon nitride, silicon carbon oxide, carbon nitride, the like, or a combination thereof, and may be deposited by chemical vapor deposition (CVD), plasma enhanced CVD (PECVD), atomic layer deposition (ALD), or another deposition technique. The first ILD 38 may comprise or be silicon dioxide, a low-k dielectric material (e.g., a material having a dielectric constant lower than silicon dioxide), silicon oxynitride, phosphosilicate glass (PSG), borosilicate glass (BSG), borophosphosilicate glass (BPSG), undoped silicate glass (USG), fluorinated silicate glass (FSG), organosilicate glass (OSG), $SiO_xC_y$, Spin-On-Glass, Spin-On-Polymers, silicon carbon material, a compound thereof, a composite thereof, the like, or a combination thereof. The first ILD 38 may be deposited by spin-on, CVD, Flowable CVD (FCVD), PECVD, physical vapor deposition (PVD), or another deposition technique. The first ILD 38 can be planarized after being deposited. A planarization process, such as a Chemical Mechanical Polish (CMP), may be performed to planarize the first ILD 38.

Figure 3:
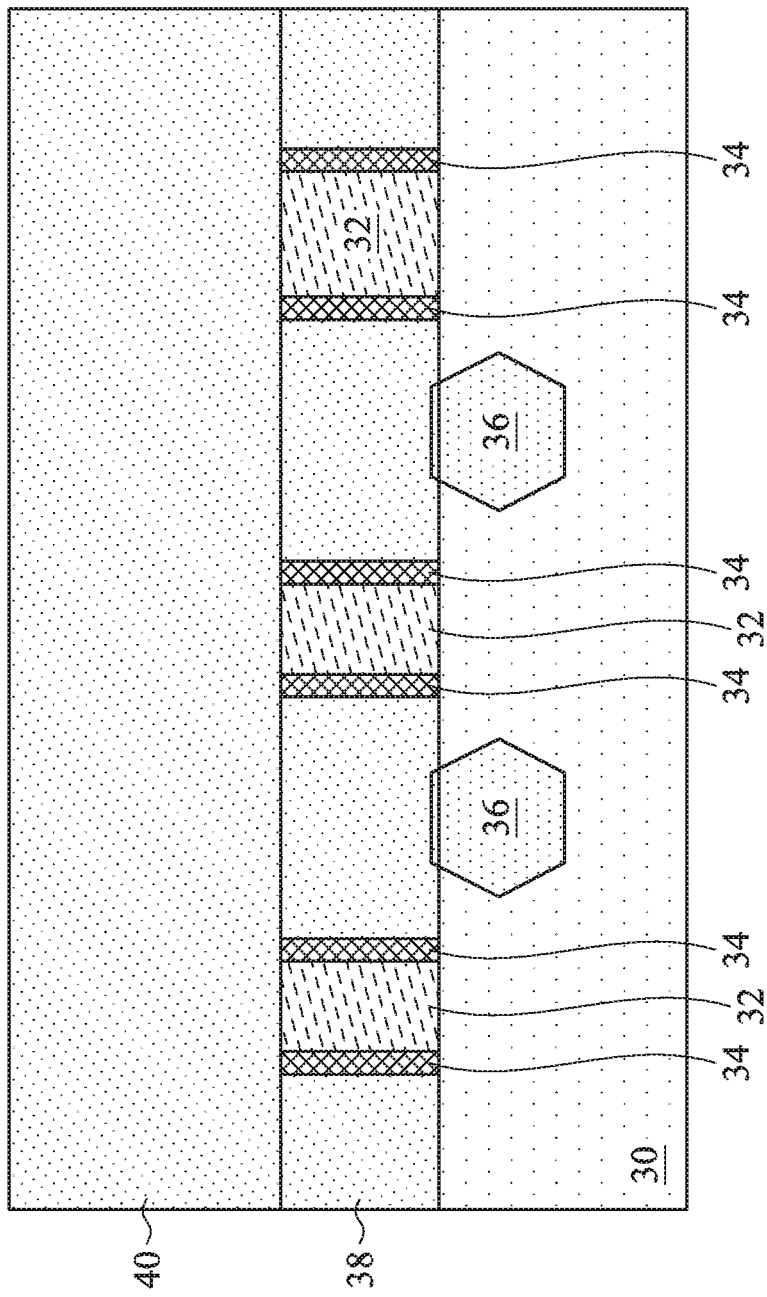

A second interlayer dielectric (ILD) 40 is formed over the first ILD 38, as shown in FIG. 3. The second ILD 40 is deposited over the first ILD 38. The second ILD 40 is made by similar material utilized to form the first ILD 38. The second ILD 40 can be planarized, such as by a CMP, after being deposited. A thickness of the first and second ILD 38, 40 can be in a range from about 50 nm to about 1200 nm. A combined thickness of the first and second ILD 38, 40 can be in a range from about 100 nm to about 2400 nm.

Figure 4:
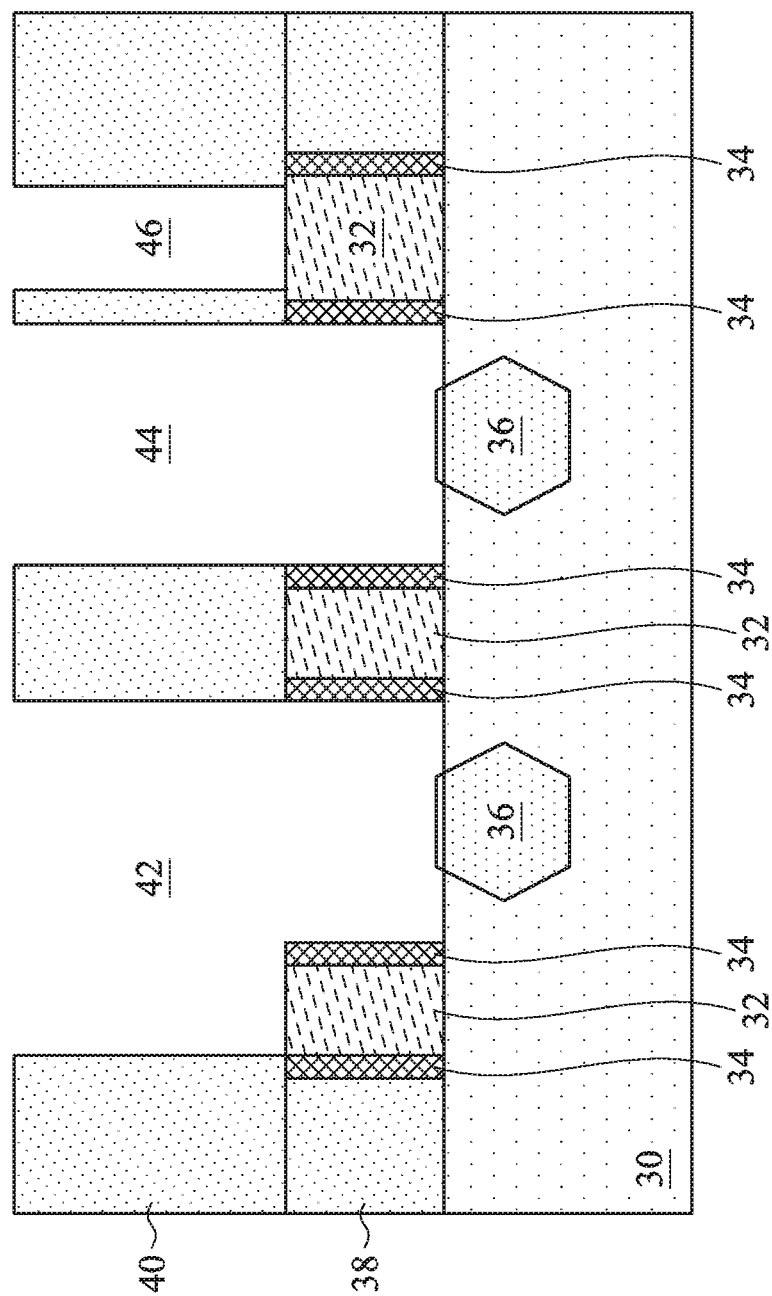

Referring back to the process 100 depicted in FIG. 1, at operation 106, a patterning process is performed to form openings 42, 44, and 46 through the second ILD 40 and the first ILD 38, as shown in FIG. 4. The first opening 42 exposes a gate stack 32 and an adjoining source/drain region 36. The first opening 42 is therefore for forming a butted conductive feature between the exposed gate stack 32 and adjoining source/drain region 36. The second opening 44 exposes a source/drain region 36, and is therefore for forming a conductive feature to the exposed source/drain region 36. The third opening 46 exposes a gate stack 32, and is therefore for forming a conductive feature to the exposed gate stack 32. The openings 42, 44, and 46 may be formed using, for example, appropriate photolithography and etching processes.

Figure 5:
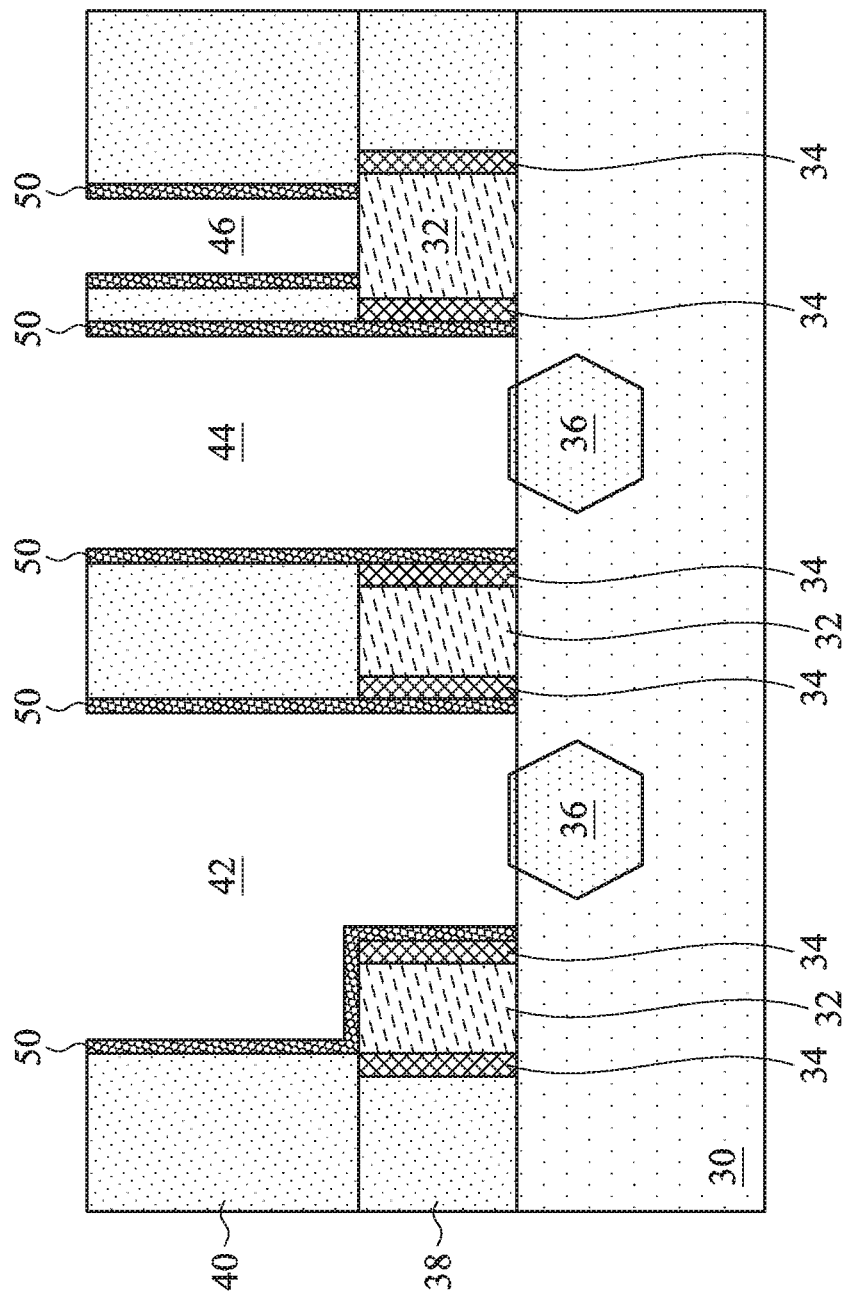
Figure 6:
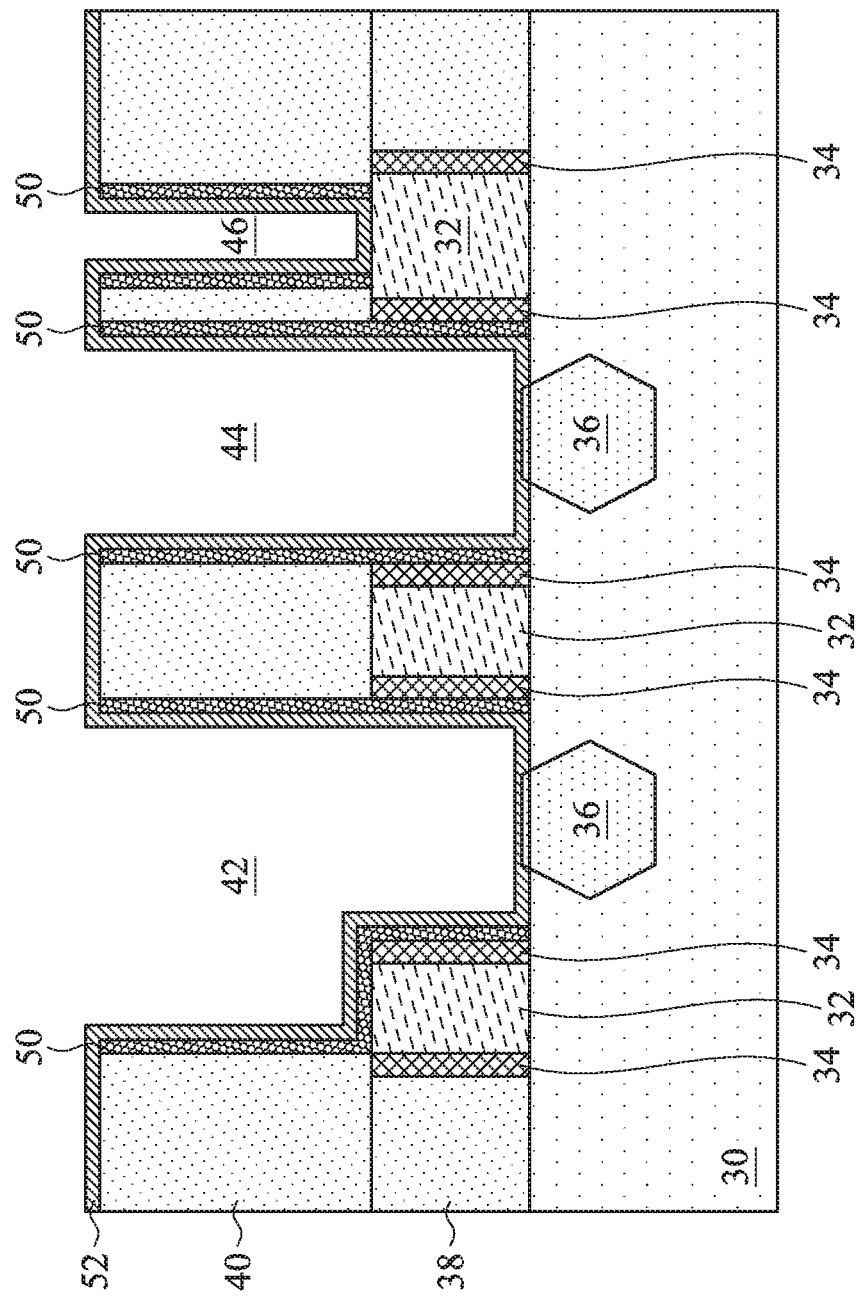

At operation 108, a welding layer 50 is formed in the openings 42, 44, and 46, followed by a first barrier layer 52 is conformally formed thereon. In some embodiments, the welding layer 50 is also called a wetting layer or a glue layer. The welding layer 50 is patterned so that the welding layer 50 is formed on the sidewalls of the openings 42, 44, 46 while exposing the underlying source/drain region 36, as shown in FIG. 5, for the later annealing process. Subsequently, the first barrier layer 52 is conformally formed on the welding layer 50 in the openings 42, 44, and 46 as well as on the exposed source/drain regions 36, exposed gate stacks 32, sidewalls of second ILD 40, and the top surface of the second ILD 40, as shown in FIG. 6. In some embodiments, the first barrier layer 52 is also called an adhesion layer or an anti-reflection coating (ARC) layer as needed.

In one example, the welding layer 50 may be or comprises a dielectric material comprising silicon, such as silicon oxide, silicon nitride, silicon carbide, silicon oxycarbide, silicon oxynitride the like, or multilayers thereof. The welding layer 50 may be formed by PECVD, low pressure CVD (LPCVD), Flowable CVD, ALD, or another deposition technique. It is believed that the dielectric material provided by the welding layer 50 can provide good interface bonding between the ILDs 38, 40 and the first barrier layer 52, which will be discussed further below, with good interface adhesion and integration. The dielectric material from the welding layer 50 can include silicon elements and other elements, such as nitrogen, oxygen and/or carbon elements. Thus, the silicon elements from the welding layer 50 may have a bonding energy to bond on the first and second ILD 38, 40, which also can have silicon elements. Thus, by utilizing the welding layer 50 of a dielectric material comprising silicon, good interface adhesion and integration may be obtained.

Furthermore, as the welding layer 50 selected herein is a dielectric material, the welding layer 50 is patterned to expose the underlying source/drain region 36. Thus, the first barrier layer 52 later formed thereon can be in contact with the source/drain region 36. As a result, during the subsequent annealing process, the source/drain region 36 may be converted to a silicide material by chemical reaction between the first barrier layer 52 and the source/drain region 36.

In some embodiments, the welding layer 50 formed herein in FIG. 5 is a silicon nitride material having a thickness in a range from about 0.5 nm to about 10 nm.

The first barrier layer 52 may be or comprise a metal containing material, for example, titanium, cobalt, nickel, the like or a combination thereof, and may be deposited by ALD, CVD, or another deposition technique. The first barrier layer 52 may be or comprise titanium nitride, titanium oxide, tantalum nitride, tantalum oxide, the like, or a combination thereof, and may be deposited by ALD, CVD, or another deposition technique.

Figure 7:
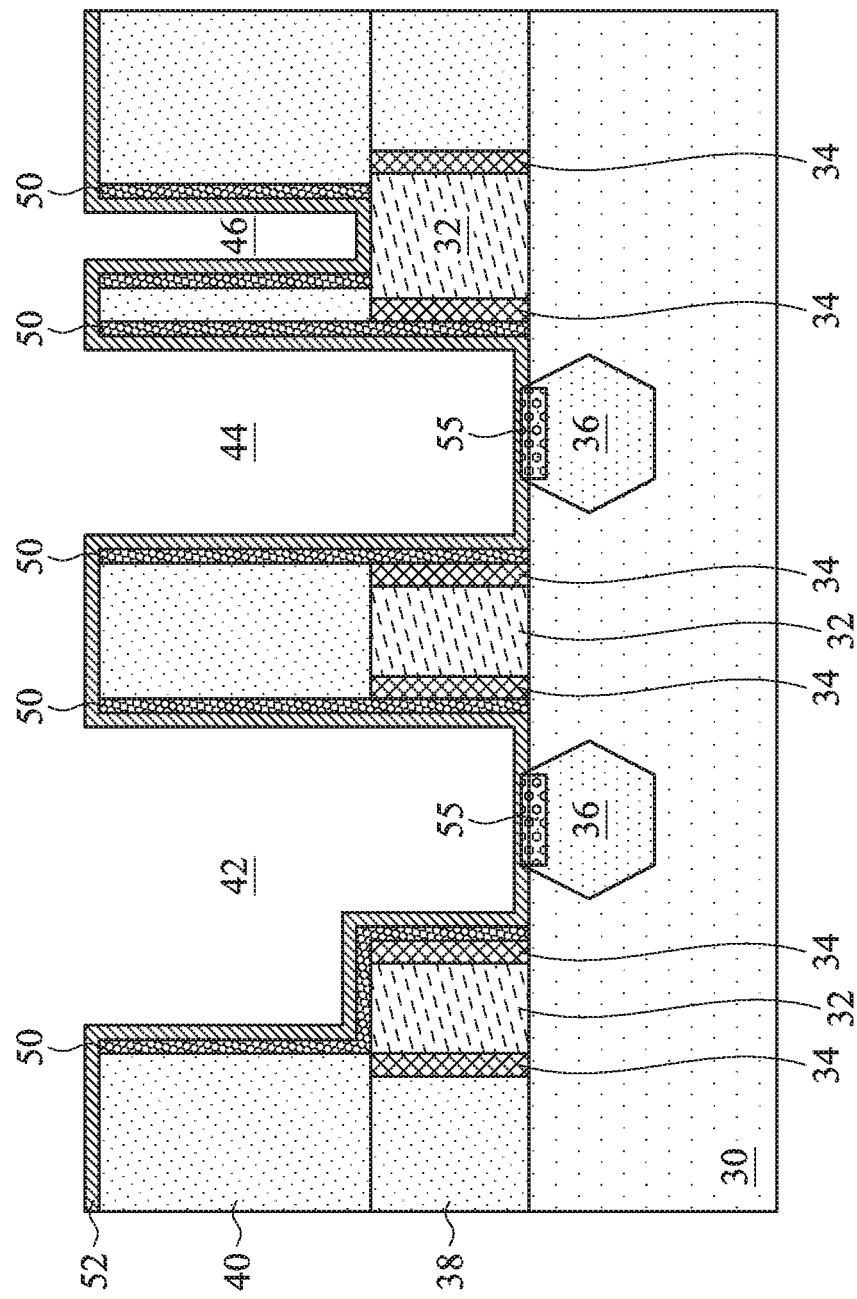

At operation 110, an annealing process can be performed to facilitate the reaction of the source/drain regions 36 with the first barrier layer 52 to form silicide regions 55 (e.g., a silicide region with a metal containing material reacted with a semiconductor material (e.g., Si and/or Ge)) on the source/drain regions 36, as shown in FIG. 7. In some examples, when the first barrier layer 52 is a layer of titanium or titanium nitride, the silicide region 55 is a titanium silicide material. Although the silicide regions 55 are only shown formed on the source/drain regions 36 in FIG. 7, it is noted that the silicide region 55 may be formed in other locations/places, such as above the gate stacks 32 or other locations as needed on the substrate 30.

Figure 8:
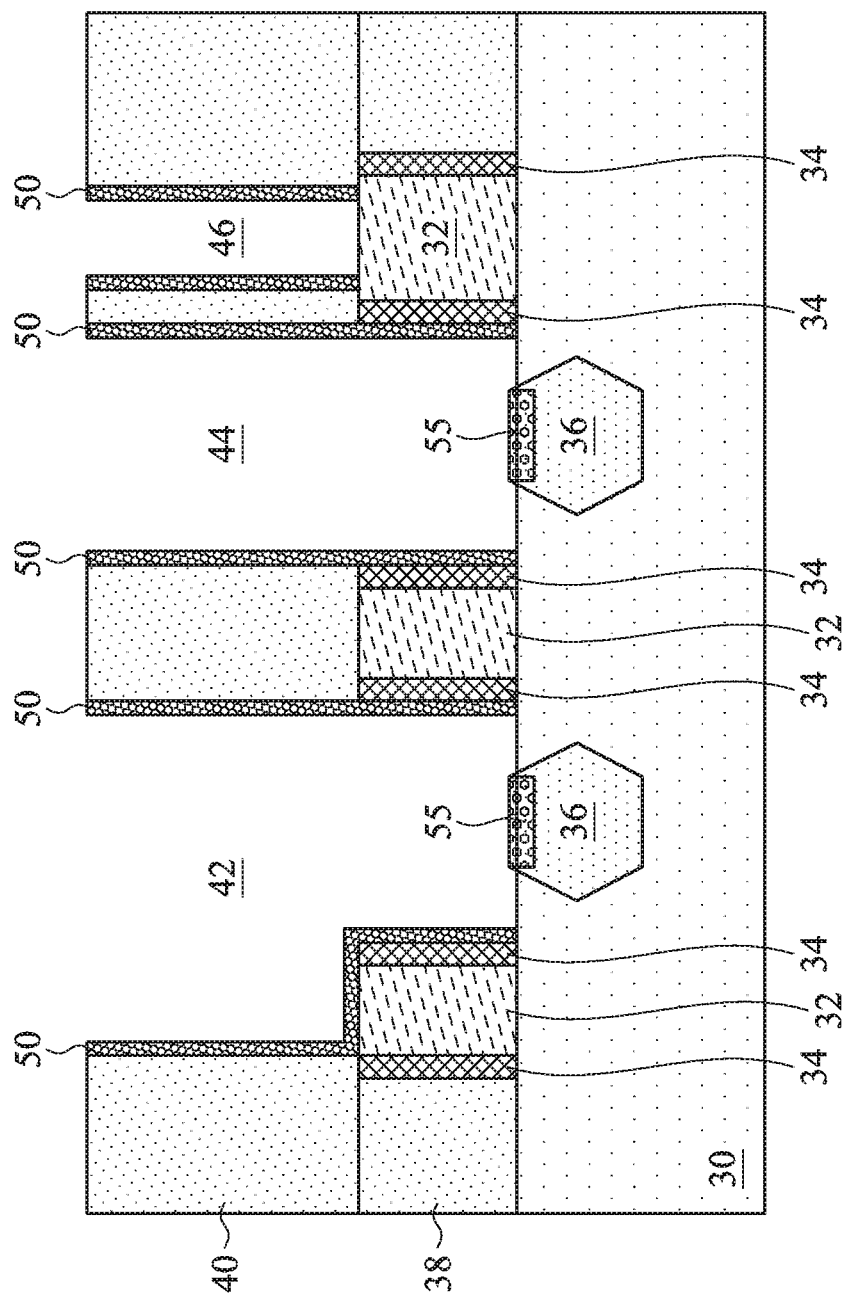

At operation 112, after the silicide regions 55 are formed, the first barrier layer 52 formed on the substrate 30 may be removed, as shown in FIG. 8. The first barrier layer 52 can be removed from the substrate 30 by suitable etching techniques, such as a reactive ion etch (RIE), neutral beam etch (NBE), wet etching, or another etching process. In some examples, the welding layer 50 remains on the substrate 30 for interface protection.

Figure 9:
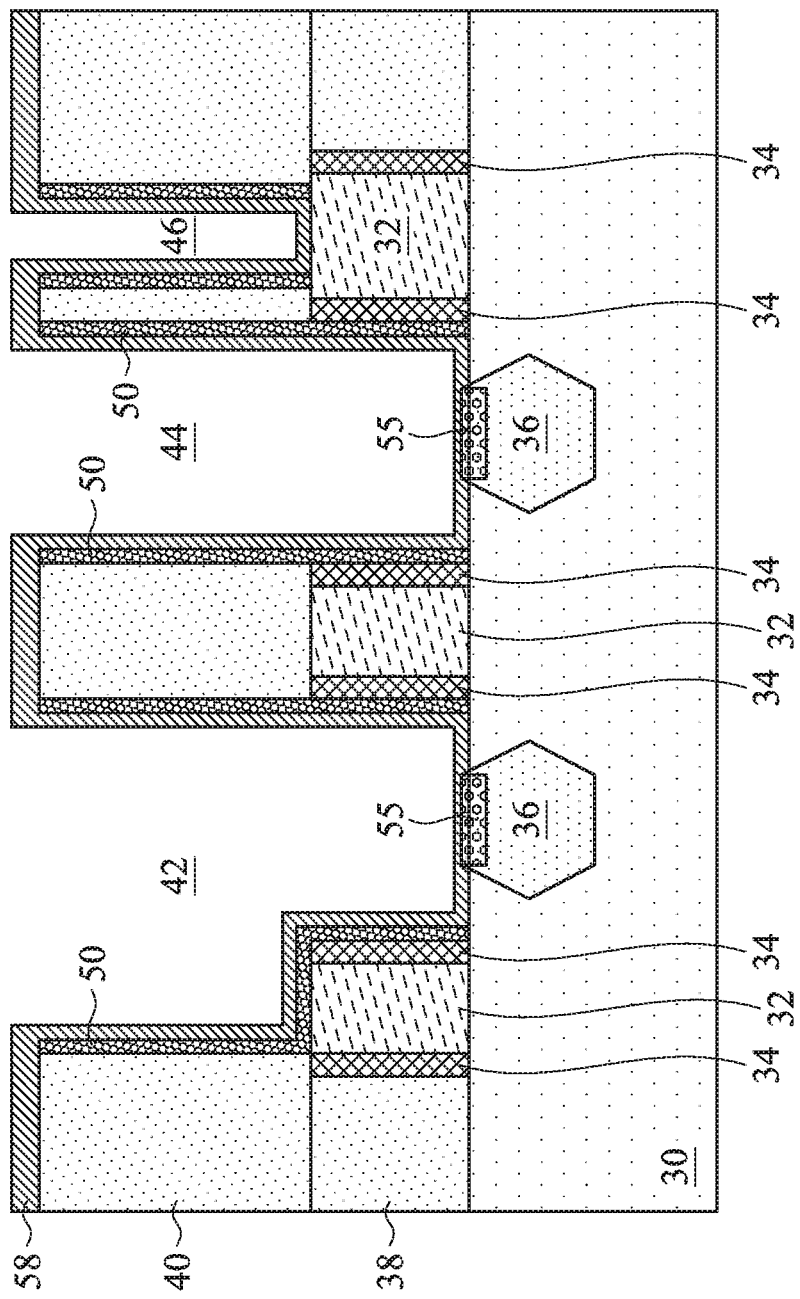

At operation 114, a second barrier layer 58 is formed on the welding layer 50, the exposed silicide region 55, the exposed first and second ILD 38, 40, and other exposed regions of the substrate 30, as shown in FIG. 9. The second barrier layer 58 may be similar to the first barrier layer 52 conformally deposited on the welding layer 50 and the substrate 30. The second barrier layer 58 may be or comprise titanium nitride, titanium oxide, tantalum nitride, tantalum oxide, the like, or a combination thereof, and may be deposited by ALD, CVD, or another deposition technique. In some examples, the second barrier layer 58 has a thickness in a range from 5 nm to about 80 nm.

In one example, the second barrier layer 58 is selected from a material sharing a similar element with the welding layer 50 so that the interface adhesion between the welding layer 50 and the second barrier layer 58 is enhanced. For example, when the welding layer 50 includes silicon elements and other elements, such as nitrogen, oxygen and/or carbon elements, the silicon elements may have a bonding energy to bond on the first and second ILD 38, 40, which also can have silicon elements. Meanwhile, the other elements (e.g., nitrogen, oxygen and/or carbon elements) from the welding layer 50 bonds to the second barrier layer 58, which is selected to at least have nitrogen, oxygen, or carbon elements. Thus, well selection of the materials between the welding layer 50 and the second barrier layer 58 can enhance the interface integration and adhesion therebetween, so as to improve the overall device structure integrity and performance. Thus, by utilizing the welding layer 50 of a dielectric material comprising silicon and other elements similar to the elements from the second barrier layer 58, good interface adhesion and integration may be obtained.

Figure 10:
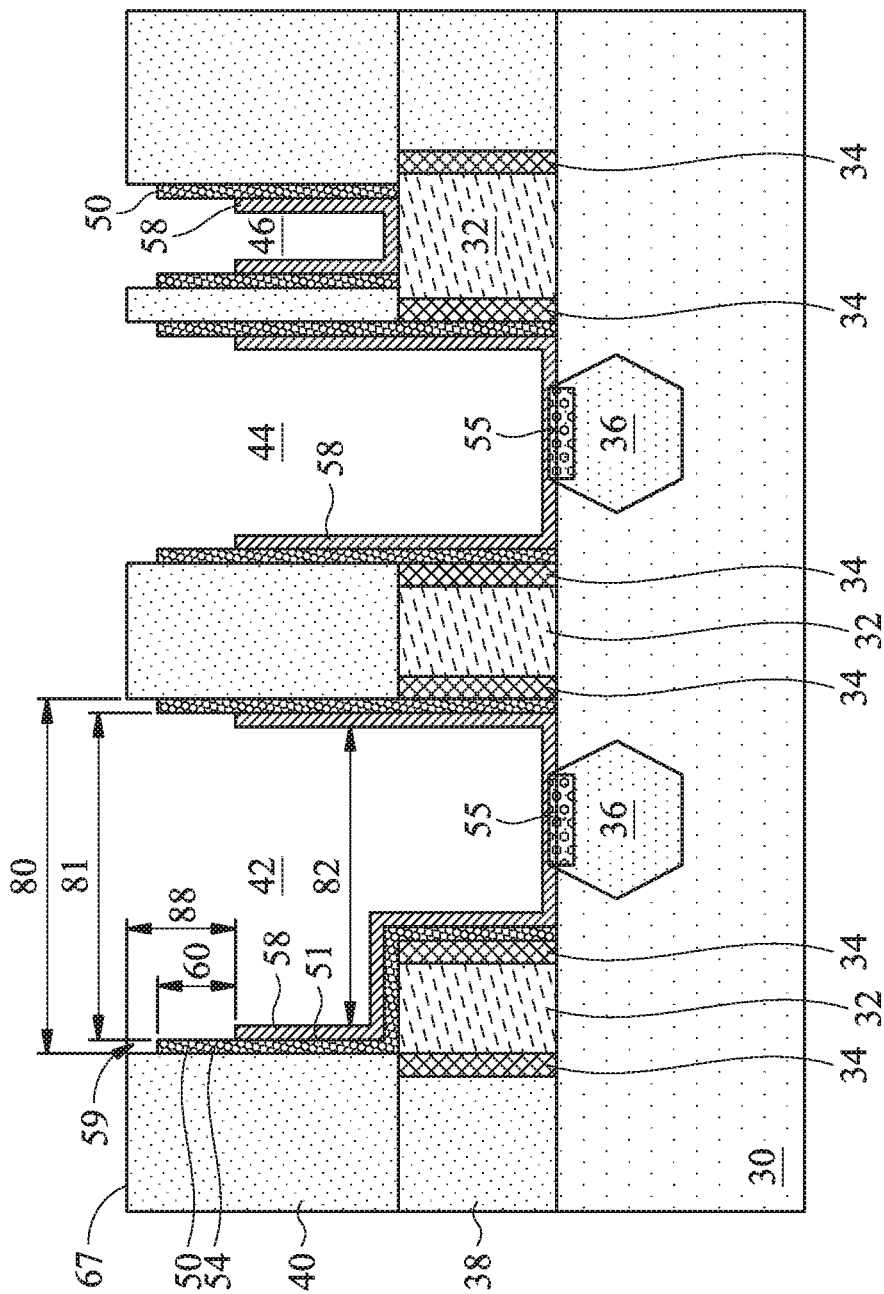

In operation 116, a pull-back process is performed to remove a portion of the second barrier layer 58 as well as a portion of the welding layer 50 from the substrate 30, as shown in FIG. 10. The pull-back process is an etching process including dry etching process or wet etching process.

In some embodiments, the pull-back process as described here to etch the second barrier layer 58 is a wet etching process so as to remove an upper portion of the second barrier layer 58 close to the corners of the openings 42, 44, 46 from the substrate 30. The pull-back process includes removing the second barrier layer 58 to a depth 88 below a top surface 67 of the second ILD 40, which removes the excess second barrier layer, which may be accumulated at the corner 59 of the opening 42, 44, 46. A top surface of the second barrier layer 58 is below the top surface 67 of the second ILD 40 as well as a top surface of the welding layer 50. By removing the upper portions of the second barrier layer 58 at upper regions (e.g., corners 59) of the openings 42, 44, and 46, a wider width 80 of the openings 42, 44, 46, without both the welding layer 50 and the second barrier layer 58, can be obtained compared to the shorter width 81 at the welding layer 50 and the even shorter width 82 at the second barrier layer 58. It is noted that a portion of the welding layer 50 is also removed during the pull-back process, which may assist widening the width 80 of the openings 42, 44, 46 for the subsequent processes. The wider widths 80, 81 of the openings 42, 44, 46 can provide a wider process window for the conductive metal fill layer subsequently formed therein with less likelihood of voids or seams formed therein. In some examples, the shorter width 81 is less than the wider width 80 by an amount in a range from about 5% to about 15% of the wider width 80, and the even shorter width 82 is less than the wider width 80 by an amount in a range from about 8% to about 30% of the wider width 80.

In some examples, the pull-back process is a wet etch process. The wet etch process can include immersing the substrate 30 in a solution comprising deionized (DI) water and a suitable chemical. The chemical reaction between the solution and the second barrier layer 58 predominately etches the second barrier layer 58 and a portion of the welding layer 50 until a predetermined process time period is reached or the desired depth 88 is formed in the openings 42, 44, 46, as shown in FIG. 10. Suitable examples of the chemicals included in the DI water include hydrogen peroxide ($H_2O_2$), ammonium hydroxide ($NH_4OH$), $HNO_3$, $H_2SO_4$, HCl, dilute-HF, and the like. In some examples, the chemical used in the DI water to etch the second barrier layer 58 includes $H_2O_2$. It is believed that $H_2O_2$ in the DI water may react with the Ti/Ta elements from the second barrier layer 58 so as to remove a portion of the second barrier layer 58 from the substrate 30.

The chemical in the DI water may have a concentration from 0.1% to 50%. The solution, during the immersion, may be at a temperature in a range from about 20° C. to about 90° C. The substrate 30 may be immersed in the solution for a duration in a range from about 5 seconds to about 120 seconds to form the depth in a range from 1 nm to 50 nm. The semiconductor substrate 30 may optionally be rinsed in isopropyl alcohol (IPA) following the immersion in the solution to dry the substrate 30.

In some examples, the second barrier layer 58 is etched back (e.g., pulled back) to expose a top portion 54 of the welding layer 50 in the openings 42, 44, 46. The top portion 54 of the welding layer 50 exposed by the second barrier layer 58 has a depth 60 of between about 15 nm and about 25 nm. As discussed above, excess second barrier layer 58 formed at corners 59 of the openings 42, 44, 46 may potentially increase the likelihood of early closure of the openings 42, 44, 46 in following deposition processes. However, the second barrier layer 58 may enable the nucleation and growth of the metal materials of the metal conductive filling material 66 subsequently filled therein. Thus, a balance of the thickness formed for the second barrier layer 58 can be modulated to both enable the growth of the following metal conductive filling material 66 as well as prevent blocking of the openings 42, 44, 46. Thus, by pulling back the second barrier layer 58 to expose a portion of the underlying welding layer 50, the second barrier layer 58 formed at the corners 59 can be removed, and the top portion of the openings 42, 44, 46 can also be widened, which can assist filling the metal conductive filling material 66 therein without early closure to prevent voids. As some amount of the second barrier layer 58 still remains in the openings 42, 44, 46, nucleation sites and adhesion surfaces also remain and can allow the metal elements to adhere thereon in the subsequent deposition process. In some examples, the depth 60 of the welding layer 50 is exposed by the second barrier layer 58, as shown in FIG. 10. In some examples, the depth 60 is in a range from about 15 nm to about 25 nm.

In the examples wherein a dry etching process is used for the pull-back process, the dry etching process may include a RIE, NBE, inductively coupled plasma (ICP) etch, the like, or a combination thereof. Example etchant gases that can be used for a plasma etch process include a halogen containing gas or another etchant gas. A flow rate of the etchant gas(es) of a plasma etch process may be in a range from about 10 sccm to about 100 sccm. A plasma etch process may implement a DC substrate bias in a range from about 10 kV to about 500 kV. A power of a plasma etch process may be in a range from about 200 W to about 2000 W. A pressure of a plasma etch process may be in a range from about 5 mTorr to about 50 mTorr. The depth 88 of the pull-back can be controlled by a duration of the etch process used for the pull-back. A duration of a plasma etch process can be in a range from about 10 seconds to about 600 seconds for achieving the depth 88 in a range from 15 nm and about 35 nm in some examples.

Figure 11:
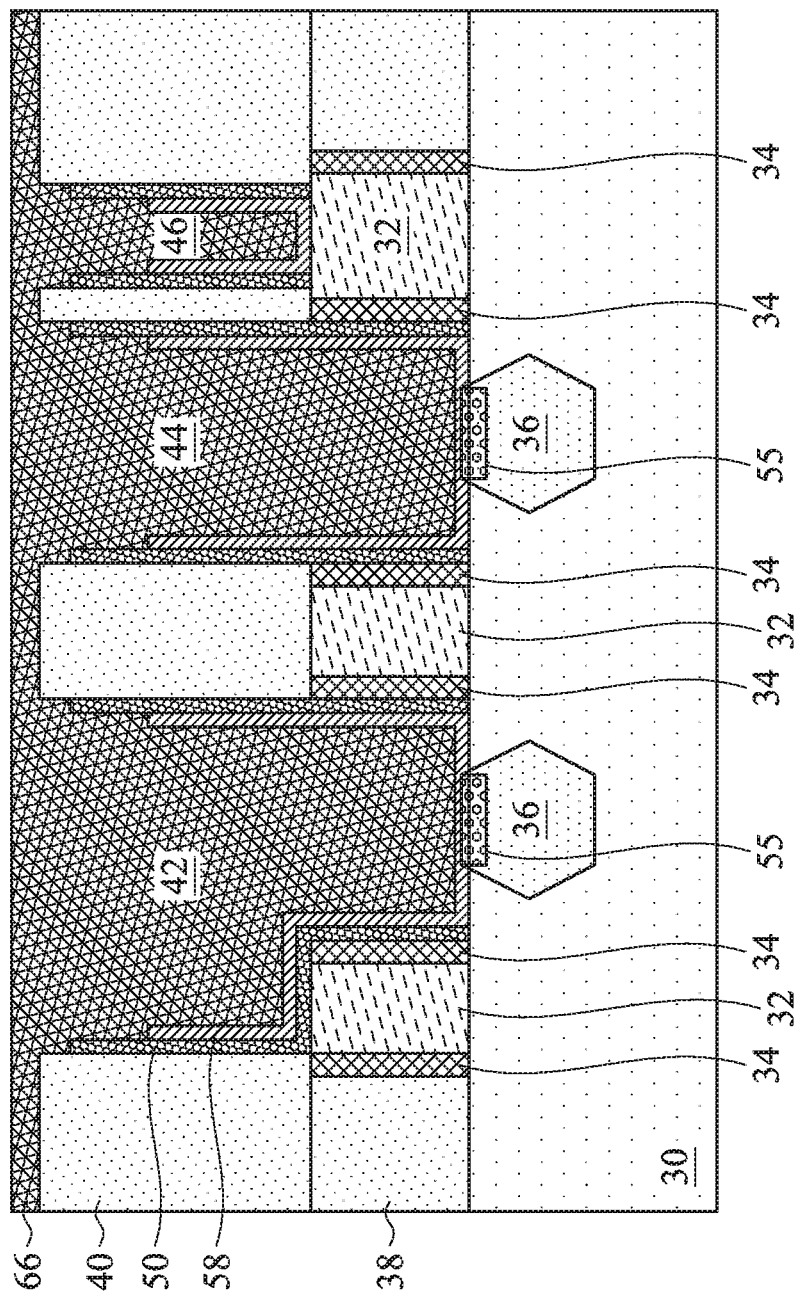

At operation 118, a metal conductive filling material 66 is formed in the openings 42, 44, and 46 and on the second barrier layer 58 and the top portion 54 of the welding layer 50, as shown in FIG. 11. The metal conductive filling material 66 may be or comprise a metal, such as cobalt, tungsten, copper, aluminum, gold, silver, alloys thereof, the like, or a combination thereof, and may be deposited by CVD, ALD, PVD, or another deposition technique. The pull-back of the second barrier layer 58 can permit larger dimensions (e.g., the widths 80, 81) at upper portions of the openings 42, 44, and 46 or compared to the lower portion second barrier layer 58 having a shorter width 82 in the openings 42, 44, 46. Thus, the larger dimensions at the upper portions of the openings 42, 44, 46 can permit the metal conductive filling material 66 to fill the openings 42, 44, and 46 without a void in the metal conductive filling material 66 in the openings 42, 44, and 46.

Figure 12:
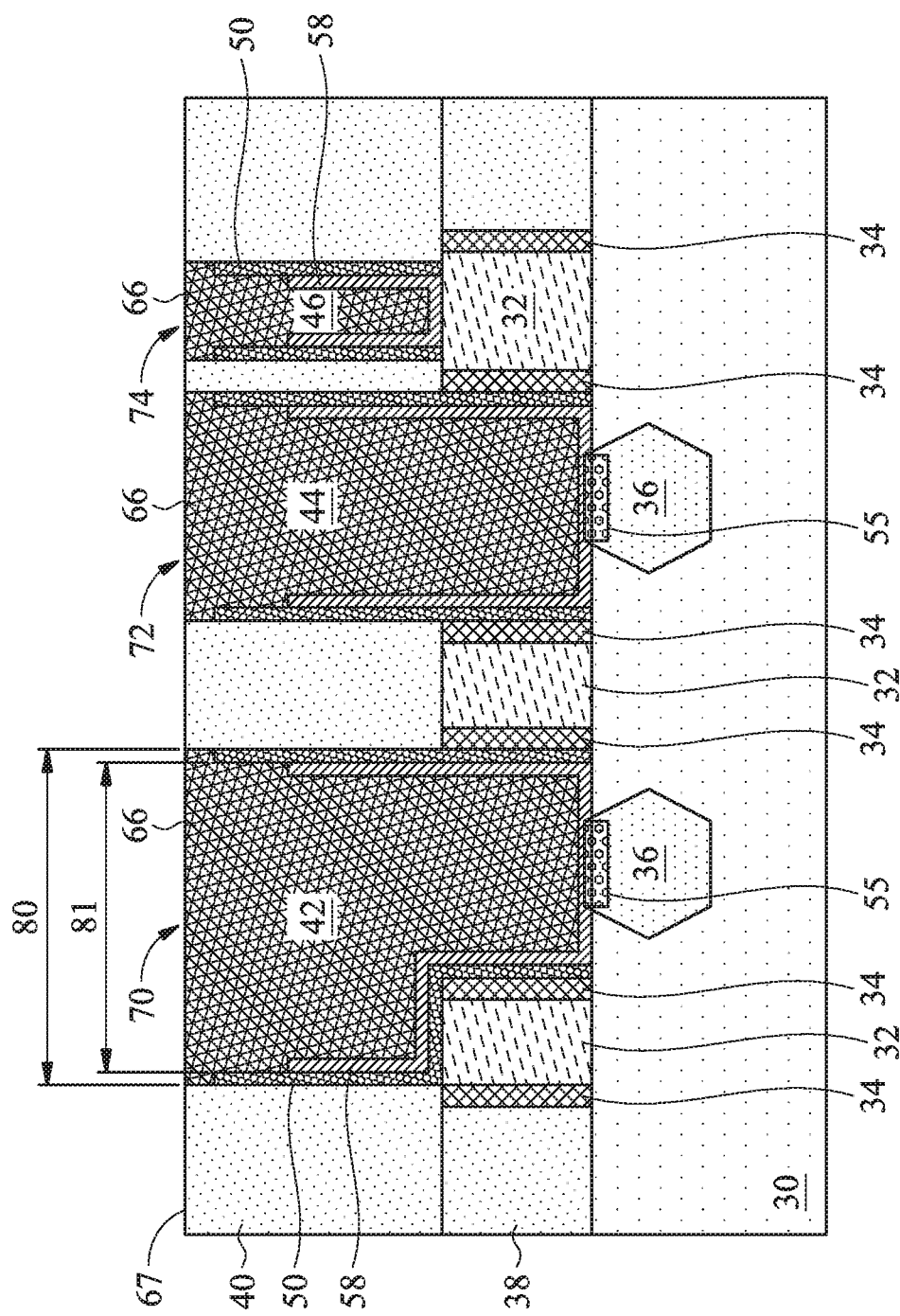

In some examples, excess metal conductive filling material 66 may be removed, as shown in FIG. 12. After the metal conductive filling material 66 is deposited, excess metal conductive filling material 66 over the top surface 67 of the second ILD 40 may be removed by using a planarization process, such as a CMP, for example. The planarization process may remove excess metal conductive filling material 66 from above the top surface 67 of the second ILD 40. This forms conductive features 70, 72, 74 comprising the metal conductive filling material 66 in the openings 42, 44, and 46, respectively. Top surfaces of the conductive features 70, 72, 74 and second ILD 40 may be coplanar. Accordingly, conductive features 70, 72, 74 including the metal conductive filling material 66, second barrier layers 58 and welding layer 50 (and, possibly, silicide regions 55) may be formed to corresponding gate stacks 32 and/or source/drain regions 36. As apparent from FIG. 12, the widths of the metal conductive filling material 66 of the conductive features 70, 72, and 74 at the top surfaces thereof can be increased by pulling back the second barrier layer 58 and the welding layer 50, which can increase a surface area to which respective subsequent conductive features can make contact.

As shown by the preceding, aspects of some embodiments can be applied to Front End Of the Line (FEOL) and Middle End Of the Line (MEOL) processes. Conductive features 70, 72, and 74, including the processes by which the conductive features 70, 72, and 74 were formed, can implement aspects of various embodiments in FEOL and/or MEOL. Other conductive features formed in FEOL and/or MEOL processes may similarly incorporate aspects according to some embodiments. For example, replacement gate stacks can be formed according to some embodiments. For replacement gate stacks, for example, conformal layers, such as a dielectric layer and/or work-function tuning layer(s), that are formed where a dummy gate stack was removed can be deposited and pulled back according to the same or similar processes illustrated and described above. In other examples, aspects of the foregoing can be incorporated in conductive features formed in intermetallization dielectrics (IMDs) in Back End Of the Line (BEOL) processing.

Some embodiments can achieve advantages. By removing a portion of a barrier layer at an upper portion of an opening or recess, conductive material that will form a conductive feature can be more easily deposited in the opening or recess without a void being formed in the opening or recess. Particularly when dimensions of conductive features are small, voids in conductive features can cause higher resistance of the conductive features or complete failure of the conductive feature, such as by failing to establish electrical contact. Hence, mitigating void formation may be advantageous, particularly in small technology nodes, such as advanced technologies with small dimensions. Further, heights of welding layers and barrier layers in conductive features can be tuned based on different process control and device performance requirements.

In an embodiment, a method for a semiconductor process includes forming a dielectric welding layer along a sidewall of an opening in a dielectric layer, forming a barrier layer on the dielectric welding layer, etching back a portion of the barrier layer to expose a side surface of an upper portion of the dielectric welding layer and forming a conductive material on the side surface of the upper portion of the dielectric welding layer and on the barrier layer. In an embodiment, the barrier layer is wet etched using a solution including at least one of $H_2O_2$, $H_2SO_4$, $HNO_3$, $NH_4OH$, or a combination thereof. In an embodiment, a portion of the conductive material is in direct contact with the side surface of the upper portion of the dielectric welding layer. In an embodiment, the barrier layer includes at least one of titanium nitride, titanium oxide, tantalum nitride and tantalum oxide. In an embodiment, the dielectric welding layer is a silicon-containing dielectric material. In an embodiment, the dielectric welding layer includes at least one of silicon oxide, silicon nitride, silicon carbide, silicon oxycarbide and silicon oxynitride. In an embodiment, the side surface of the upper portion of the dielectric welding layer exposed by the etching back of the portion of the barrier layer is exposed to a depth in a range from about 15 nm to about 25 nm. In an embodiment, a top surface of the barrier layer is lower than a top surface of the dielectric welding layer on the sidewall of the opening of the dielectric layer.

In another embodiment, a structure includes a dielectric layer having a sidewall, the dielectric layer being over a substrate, a dielectric welding layer along the sidewall, the dielectric welding layer exposing an upper portion of the sidewall, a barrier layer along the dielectric welding layer, the barrier layer exposing an upper portion of the dielectric welding layer, and a conductive material along the barrier layer and along the respective upper portions of the sidewall and the dielectric welding layer. In an embodiment, the conductive material has a top width in contact with the dielectric welding layer wider than a bottom width in contact with the barrier layer. In an embodiment, the conductive material is in direct contact with the upper portion of the dielectric welding layer. In an embodiment, a depth is defined between respective top surfaces of the dielectric welding layer and the barrier layer, wherein the depth is from about 15 nm to 25 nm. In an embodiment, a top surface of the barrier layer is below a top surface of the dielectric welding layer. In an embodiment, the conductive material includes at least one of cobalt, tungsten, copper, aluminum, gold and silver. In an embodiment, a silicide region is formed along a bottom of the barrier layer under the conductive material. In an embodiment, the dielectric welding layer is a silicon-containing dielectric material. In an embodiment, the dielectric welding layer includes at least one of silicon oxide, silicon nitride, silicon carbide, silicon oxycarbide and silicon oxynitride. In an embodiment, the barrier layer includes at least one of titanium nitride, titanium oxide, tantalum nitride and tantalum oxide.

In yet another embodiment, a structure includes a dielectric layer, a conductive material formed in the dielectric layer and laterally bound by a barrier layer, and a dielectric welding layer laterally between the barrier layer and the dielectric layer, wherein the barrier layer and the dielectric welding layer have mismatched heights along a sidewall of the dielectric layer. In an embodiment, the mismatched heights define a step height in a range from 15 nm to 25 nm.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
    a source/drain region;
    a first gate structure adjacent the source/drain region;
    a dielectric layer over the first gate structure and the source/drain region; and
    a contact structure extending through the dielectric layer to the source/drain region, the contact structure comprising:
        a welding layer, wherein an upper surface of the welding layer is lower than an upper surface of the dielectric layer, wherein the welding layer and the dielectric layer have a common element;
        a barrier layer on the welding layer, wherein an upper surface of the barrier layer is lower than the upper surface of the welding layer, wherein the welding layer and the second barrier layer have a common element; and
        a metal conductive filling material over the second barrier layer, wherein the second barrier layer completely separates the metal conductive filling material from the source/drain region.

2. The semiconductor device of claim 1, wherein the upper surface of the barrier layer is recessed a distance in a range from about 15 nm to about 25 nm below the upper surface of the welding layer.

3. The semiconductor device of claim 1, wherein the dielectric layer comprises a plurality of dielectric layers.

4. The semiconductor device of claim 1, wherein a first width is from a first sidewall of the dielectric layer to a second sidewall of the dielectric layer, wherein a second width is from a first inner sidewall of the welding layer to a second inner sidewall of the welding layer, wherein second width is in a range from 5% to 15% less than the first width.

5. The semiconductor device of claim 1, wherein a first width is from a first sidewall of the dielectric layer to a second sidewall of the dielectric layer, wherein a second width is from a first inner sidewall of the barrier layer to a second inner sidewall of the barrier layer, wherein second width is in a range from 8% to 30% less than the first width.

6. The semiconductor device of claim 1, wherein the second barrier layer directly contacts the source/drain region.

7. The semiconductor device of claim 1, wherein the second barrier layer comprises nitrogen elements, oxygen elements, or carbon elements.

8. A semiconductor device comprising:
a source/drain region, the source/drain region comprising a silicide region;
a first gate structure adjacent the source/drain region;
one or more dielectric layers over the first gate structure and the source/drain region; and
a contact structure extending through the one or more dielectric layers to the silicide region of the source/drain region, the contact structure comprising:
a welding layer, wherein an upper surface of the welding layer is lower than an upper surface of the one or more dielectric layers;
a barrier layer on the welding layer and extending over the silicide region, wherein an upper surface of the barrier layer is lower than the upper surface of the welding layer, wherein the barrier layer completely covers the silicide region; and
a metal conductive filling material over the second barrier layer.

9. The semiconductor device of claim 8, wherein the contact structure extends from the source/drain region to over the first gate structure.

10. The semiconductor device of claim 8, wherein the welding layer and a first dielectric layer of the one or more dielectric layers have a common element.

11. The semiconductor device of claim 8, wherein the welding layer and the second barrier layer have a common element.

12. The semiconductor device of claim 8, wherein the welding layer includes at least one of silicon oxide, silicon nitride, silicon carbide, silicon oxycarbide, and silicon oxynitride.

13. The semiconductor device of claim 8, wherein the metal conductive filling material directly contacts the upper surface of the welding layer and the upper surface of the barrier layer.

14. The semiconductor device of claim 8, wherein the silicide region directly contacts the barrier layer.

15. The semiconductor device of claim 8, wherein the barrier layer and the silicide region have a common element.

16. A method for a semiconductor process, the method comprising:
forming shared source/drain region, a first gate structure, and a second gate structure, the shared source/drain region being a source/drain region for both the first gate structure and the second gate structure, the first gate structure comprising a first gate spacer and a first gate electrode, the second gate structure comprising a second gate spacer and a second gate electrode;
forming one or more dielectric layers over the first gate structure, the second gate structure, and the source/drain region;
forming a first opening through the one or more dielectric layers, the first opening exposing the source/drain region, a sidewall of the first gate spacer, and a sidewall of the second gate spacer;
forming a welding layer along sidewalls of the first opening in the one or more dielectric layers, the sidewall of the first gate spacer, and the sidewall of the second gate spacer, an upper surface of the one or more dielectric layers being free of the welding layer, wherein the welding layer and the one or more dielectric layers have a first common element;
forming a barrier layer on the welding layer, wherein the welding layer and the barrier layer have a second common element, wherein the barrier layer contacts an upper surface of the one or more dielectric layers;
etching back a portion of the welding layer and the barrier layer to expose a sidewall of the one or more dielectric layers and a sidewall of the welding layer; and
forming a conductive material over the barrier layer.

17. The method of claim 16, wherein the first common element is silicon.

18. The method of claim 16, wherein the second common element is nitrogen, silicon, or carbon.

19. The method of claim 16, wherein the first opening exposes an upper surface of the first gate electrode.

20. The method of claim 19 further comprising:
forming a third gate structure, wherein the one or more dielectric layers are formed over the third gate structure; and
forming a second opening through the one or more dielectric layers, the second opening exposing an upper surface of the third gate structure, wherein the welding layer and the barrier layer extends along sidewalls of the second opening to the third gate structure.

21. The method of claim 16, wherein an upper surface of the barrier layer is recessed from an upper surface of the one or more dielectric layers by an amount in a range from about 15 nm to about 35 nm.

* * * * *

UNITED STATES PATENT AND TRADEMARK OFFICE
CERTIFICATE OF CORRECTION

PATENT NO. : 11,062,941 B2
APPLICATION NO. : 16/806931
DATED : July 13, 2021
INVENTOR(S) : Chang et al.

Page 1 of 1

It is certified that error appears in the above-identified patent and that said Letters Patent is hereby corrected as shown below:

In the Claims

Claim 1, Column 10, Lines 58 and 60-61; delete "second" before "barrier"

Claim 8, Column 11, Line 38; delete "second" before "barrier"

Signed and Sealed this
Fourteenth Day of September, 2021

Drew Hirshfeld
*Performing the Functions and Duties of the
Under Secretary of Commerce for Intellectual Property and
Director of the United States Patent and Trademark Office*